(12) United States Patent
Yang et al.

(10) Patent No.: US 12,120,479 B2
(45) Date of Patent: Oct. 15, 2024

(54) CAPACITANCE DETECTION APPARATUS AND EARPHONE

(71) Applicant: Shenzhen Goodix Technology Co., Ltd., Guangdong (CN)

(72) Inventors: Ming Yang, Shenzhen (CN); Zhe Chen, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 483 days.

(21) Appl. No.: 17/503,695

(22) Filed: Oct. 18, 2021

(65) Prior Publication Data

US 2022/0303661 A1   Sep. 22, 2022

Related U.S. Application Data

(63) Continuation of application No. PCT/CN2021/081884, filed on Mar. 19, 2021.

(51) Int. Cl.
*H04R 1/10* (2006.01)

(52) U.S. Cl.
CPC ................................ *H04R 1/1041* (2013.01)

(58) Field of Classification Search
CPC .................................................... H04R 1/1041
USPC .......................................................... 381/74
See application file for complete search history.

(56) References Cited

U.S. PATENT DOCUMENTS

| | | |
|---|---|---|
| 2011/0182457 A1 | 7/2011 | Tung et al. |
| 2019/0297408 A1 | 9/2019 | Mohammadi et al. |
| 2020/0103446 A1 | 4/2020 | Cheng et al. |
| 2021/0018339 A1 | 1/2021 | Yang et al. |
| 2021/0044885 A1 | 2/2021 | Fukahori et al. |

FOREIGN PATENT DOCUMENTS

| | | |
|---|---|---|
| CN | 107820149 A | 3/2018 |
| CN | 110677764 A | 1/2020 |
| CN | 111343536 A | 6/2020 |

(Continued)

OTHER PUBLICATIONS

Extended European Search Report issued on Jul. 4, 2022 in connection with corresponding European application No. 21798539.9 (17pp).

(Continued)

*Primary Examiner* — Sean H Nguyen
(74) *Attorney, Agent, or Firm* — Maier & Maier, PLLC

(57) ABSTRACT

A capacitance detection apparatus and earphone. The capacitance detection apparatus includes a front housing and a rear housing, where the capacitance detection apparatus includes: a circuit board, a sensing electrode and a processing unit which are provided at the front housing, where the circuit board, the sensing electrode and the processing unit are integrated together; the sensing electrode is arranged in a first area of the circuit board, the processing unit is arranged in a second area of the circuit board, and the sensing electrode and the processing unit are electrically connected through a metal wiring layer in the circuit board; the sensing electrode is configured to sense a to-be-measured object and form a capacitance detection signal, the capacitance detection signal is transmitted to the processing unit through the metal wiring layer, and the processing unit is configured to process the capacitance detection signal to detect the to-be-measured object.

20 Claims, 5 Drawing Sheets

(56) References Cited

FOREIGN PATENT DOCUMENTS

| | | |
|---|---|---|
| CN | 211152176 A | 7/2020 |
| CN | 211930838 A | 11/2020 |

OTHER PUBLICATIONS

International Search Report dated Oct. 26, 2021, in connection with corresponding PCT Application No. PCT/CN2021/081884; 4 pp.
Office Action issued on May 13, 2024, in corresponding European Application No. 21798539.9, 7 pages.

CAPACITANCE DETECTION APPARATUS AND EARPHONE

CROSS-REFERENCE TO RELATED APPLICATION

This application is a continuation of International Application No. PCT/CN2021/081884, filed on Mar. 19, 2021, which is hereby incorporated by reference in its entirety.

TECHNICAL FIELD

This application relates to the field of electronic technology, and more particularly, to a capacitance detection apparatus and a headset.

BACKGROUND

At present, the market of earphones shows trends to be wireless, intelligentized, digitalized, etc. Intelligentization is to improve user experience, such as in-ear detection function where an earphone can automatically sense when it is worn in or out of an ear and play or pause songs in time. As earphones have more and more functions, the requirements of earphones for the integration of functional modules become higher and higher. In a traditional capacitance sensing solution for in-ear detection, capacitance signal transmission is susceptible to interference, and related functional tests can only be performed after the assembly of the whole earphone has been completed, which is not conducive to the improvement of the production efficiency and yield of the whole earphone.

SUMMARY

A capacitance detection apparatus and an earphone are provided, which can improve the detection performance of the capacitance detection apparatus and improve the production efficiency and yield of the earphone where the capacitance detection apparatus is located.

In a first aspect, a capacitance detection apparatus is provided, which is applied to an earphone, where the earphone includes a front housing and a rear housing, and the capacitance detection apparatus includes: a circuit board, a sensing electrode and a processing unit which are provided at the front housing of the earphone, where the circuit board, the sensing electrode and the processing unit are integrated together; the sensing electrode is arranged in a first area of the circuit board, the processing unit is arranged in a second area of the circuit board, and the sensing electrode and the processing unit are electrically connected through a metal wiring layer in the circuit board; the sensing electrode is configured to sense a to-be-measured object and form a capacitance detection signal, the capacitance detection signal is transmitted to the processing unit through the metal wiring layer, and the processing unit is configured to process the capacitance detection signal to detect the to-be-measured object.

Based on the technical solution of this application, the circuit board, the sensing electrode and the processing unit in the capacitance detection apparatus are integrated together and provided at the front housing of the earphone, which is more conducive to the integration and miniaturization of the capacitance detection apparatus compared with the discrete arrangement solution in the related art where the sensing electrode is provided at the front housing of the earphone while the processing unit is provided at the rear housing, thereby saving the space occupied by the capacitance detection apparatus in the earphone. In addition, the sensing electrode and the processing unit are electrically connected through the metal wiring layer in the circuit board, and the process is simple and easy to implement. Further, in this implementation, the distance of the analog signal line between the sensing electrode and the processing unit is very short, and therefore, it has very good anti-interference performance, and is beneficial to the improvement of the capacitance detection performance. Furthermore, during the assembling process of the earphone, tests on related functions can be performed when the earphone is in a semi-manufactured state, that is, when the capacitance detection apparatus is assembled at the front housing of the earphone, thereby improving the production efficiency and yield of the earphone.

In some possible implementations, the sensing electrode and the processing unit are respectively arranged on a first surface and a second surface of the circuit board, where the first surface is a surface of the circuit board facing the to-be-measured object, and the second surface is a surface of the circuit board facing away from the to-be-measured object.

Based on the solution of this embodiment, a vertical distance between the sensing electrode and the processing unit is very short, which can further reduce the length of the analog signal line between the sensing electrode and the processing unit, and can make full use of the space in the vertical direction. Compared with the technical solution where the sensing electrode and the processing unit are both arranged on a same surface of the circuit board, the area occupied by the capacitance detection apparatus can be reduced. Further, the sensing electrode is arranged on a surface of the circuit board facing the to-be-measured object, which can make the sensing electrode sense the to-be-measured object, such as the proximity of a user's human body, more easily and generate a stronger capacitance detection signal to improve the capacitance detection performance.

In some possible implementations, the circuit board is a flexible circuit board, and the capacitance detection apparatus further includes: a temperature drift compensator, provided on the flexible circuit board and configured to compensate for a temperature drift of the capacitance detection signal of the sensing electrode on the flexible circuit board.

Since the circuit board is a flexible circuit board, it is affected by the dielectric constant, thermal stability, thermal expansion coefficient and other factors of its substrate, and the capacitance detection signal of the sensing electrode arranged on its surface will have a temperature drift. Therefore, in the technical solution of the embodiment of this application, the temperature drift compensator can be provided in the capacitance detection apparatus to compensate for the temperature drift of the capacitance detection signal of the sensing electrode, so as to improve the accuracy of capacitance detection. Based on the compensation for the temperature drift and the improvement of accuracy of capacitance detection, the signal amount of the capacitance detection signal of the sensing electrode can be appropriately reduced, which can also meet certain detection requirements. In other words, the area of the sensing electrode can be reduced to further realize size reduction of the capacitance detection apparatus, so that it has a wider range of application scenarios.

In some possible implementations, the temperature drift compensator includes: a reference electrode arranged in a third area of the circuit board and configured to form a capacitance detection signal, the reference electrode and the processing unit are electrically connected through the metal wiring layer in the circuit board, and the reference capacitance detection signal of the reference electrode is configured to compensate for the temperature drift of the capacitance detection signal of the sensing electrode.

Through the technical solutions of the embodiments of this application, the reference electrode is provided on the circuit board, and the electrical connection between the processing unit and the reference electrode is implemented through the metal wiring layer in the circuit board, so that the modular arrangement among the sensing electrode, the reference electrode and the processing unit is realized. In addition, the reference electrode is also provided on the circuit board and has a temperature very close to those of the circuit board and the sensing electrode, and therefore, it is more accurate to compensate for the temperature drift of the capacitance detection signal of the sensing electrode in this way.

In some possible implementations, the reference electrode is arranged on a side of the sensing electrode away from the to-be-measured object, and the sensing electrode covers the reference electrode.

Through the technical solution of the implementation of this application, the reference electrode is arranged on a side of the sensing electrode away from the to-be-measured object, and the sensing electrode covers the reference electrode, so that the reference electrode can be arranged close to the sensing electrode, and the temperature drift of the capacitance detection signal of the sensing electrode and that of the reference electrode are close, and the capacitance detection of the sensing electrode is not affected.

In some possible implementations, in a first period, the sensing electrode is configured to sense the to-be-measured object and form the capacitance detection signal; in a second period, the reference electrode is configured to form the reference capacitance detection signal, and the sensing electrode is configured to receive a shielding signal to shield influence of the to-be-measured object on the reference capacitance detection signal of the reference electrode, where the shielding signal includes: a ground signal, a direct current signal, or a signal with a same frequency and phase as the reference capacitance detection signal.

Through the technical solution of the implementation of this application, when the reference electrode forms its reference capacitance detection signal, the sensing electrode is reused to serve as a shielding electrode of the reference electrode, so as to shield the influence of the to-be-measured object on the reference capacitance detection signal of the reference electrode, so that the reference capacitance detection signal does not include the capacitance signal of the to-be-measured object, and the reference capacitance detection signal can be directly used to represent the temperature drift of the capacitance detection signal of the sensing electrode.

In some possible implementations, in the first period, the reference electrode is configured to receive a ground signal or a direct current signal, to prevent the reference electrode from influencing the capacitance detection signal of the sensing electrode.

By means of the technical solution of the implementation of this application, in the first period, when the sensing electrode is configured to sense a to-be-measured human body and form its capacitance detection signal, the reference electrode receives a ground signal or a direct current signal to ensure that the sensing electrode is in a stable state and will not affect the capacitance detection signal of the sensing electrode, thereby improving the accuracy of capacitance detection.

In some possible implementations, the sensing electrode is arranged on a first surface of the circuit board, and the processing unit and the reference electrode are arranged on a second surface of the circuit board, where the first surface is a surface of the circuit board facing the to-be-measured object, and the second surface is a surface of the circuit board away from the to-be-measured object.

By means of the technical solution of the embodiment of the application, the positions of the sensing electrode, the reference electrode and the processing unit are reasonably arranged by utilizing the surfaces of the circuit board, and the sensing electrode is arranged on a surface of the circuit board facing the to-be-measured object, so as to ensure that the sensing electrode can be close to the to-be-measured object, thus improving the quality of its capacitance detection signal; and the reference electrode and the processing unit are arranged on a surface of the circuit board facing away from the to-be-measured object, which can not only satisfy the relative position relationship between the sensing electrode and the reference electrode of being arranged adjacently and covering each other, but also facilitate manufacturing and implementation in process.

In some possible implementations, the reference electrode and the sensing electrode have a same shape and size, and the reference electrode and the sensing electrode are arranged symmetrically with respect to the circuit board.

By means of the technical solution of the implementation of this application, the capacitance reference signal and the capacitance temperature drift signal of the reference electrode and the sensing electrode can be matched to almost the same level. Based on this, the processing unit is used to almost completely obtain the capacitance detection signal of the to-be-measured object according to the difference between the capacitance detection signal of the sensing electrode and the reference capacitance detection signal of the reference electrode. The detection result based on the capacitance signal of the to-be-measured object has high accuracy and is hardly affected by the external temperature, and the overall performance of the capacitance detection apparatus is therefore excellent.

In some possible implementations, the circuit board is a flexible circuit board, and includes: a first partial circuit board, a bending portion, and a second partial circuit board, where the first partial circuit board and the second partial circuit board are stacked and connected with each other through the bending portion; the sensing electrode and the reference electrode are arranged on the first partial circuit board, the processing unit is arranged on the second partial circuit board, and the first partial circuit board is arranged toward the to-be-measured object relative to the second partial circuit board.

By means of the technical solution of the embodiment of this application, the first partial circuit board and the second partial circuit board are stacked and connected by the bending portion, and the sensing electrode and the reference electrode are arranged on the first partial circuit board, the processing unit is arranged on the second partial circuit board, and the processing unit, the sensing electrode and the reference electrode are also stacked. Therefore, the capacitance detection apparatus in the embodiment of this application occupies a small area, and since the thickness of the circuit board is very thin, even if the first partial circuit board and the second partial circuit board are stacked, they will not occupy too much extra thickness.

In some possible implementations, the sensing electrode and the reference electrode are respectively arranged on a first surface and a second surface of the first partial circuit board, and the processing unit is arranged on a second surface of the second partial circuit board, where the first surface is a surface of the first partial circuit board and the second partial circuit board facing the to-be-measured object, and the second surface is a surface of the first partial circuit board and the second partial circuit board facing away from the to-be-measured object.

By means of the technical solution of the embodiment of the application, the positions of the sensing electrode, the reference electrode and the processing unit are reasonably arranged by utilizing the surfaces of the first partial circuit board and the second partial circuit board, and the sensing electrode is arranged on a surface of the first partial circuit board facing the to-be-measured object, so as to ensure that the sensing electrode can be close to the to-be-measured object, thus improving the quality of its capacitance detection signal; and the reference electrode is also arranged on first partial circuit, and arranged on a surface of the first partial circuit board facing away from the to-be-measured object, which enables the sensing electrode and the reference electrode to be close to each other to satisfy the relative position relationship between the sensing electrode and the reference electrode of being arranged adjacently and covering each other.

In some possible implementations, the reference electrode and the sensing electrode have a same shape and size, and the reference electrode and the sensing electrode are arranged symmetrically with respect to the first partial circuit board.

By means of the technical solution of the implementation of this application, the capacitance reference signal and the capacitance temperature drift signal of the reference electrode and the sensing electrode can be matched to almost the same level. Based on this, the processing unit is used to almost completely obtain the capacitance detection signal of the to-be-measured object according to the difference between the capacitance detection signal of the sensing electrode and the reference capacitance detection signal of the reference electrode. The detection result based on the capacitance signal of the to-be-measured object has high accuracy and is hardly affected by external temperature, and the overall performance of the capacitance detection apparatus is therefore excellent.

In some possible implementations, the capacitance detection apparatus further includes: a temperature sensor integrated in the processing unit, where a temperature signal of the temperature sensor is configured to compensate for the temperature drift of the capacitance detection signal of the sensing electrode.

Based on the technical solution of the implementation of this application, since the temperature sensor is added to compensate for the temperature drift of the capacitance detection signal of the sensing electrode, and the influence of temperature interference on capacitance detection is eliminated. Therefore, the capacitance detection apparatus can have higher accuracy of capacitance detection. In addition, the temperature sensor is integrated in the processing unit. The temperature sensor does not need to take up space, but can be directly integrated into the processing unit, which is also conducive to realizing the size reduction of the capacitance detection apparatus. Further, the measured temperature signal is also close to the temperature of the sensing electrode, so the capacitance detection signal of the sensing electrode has a better temperature drift compensation effect.

In some possible implementations, the processing unit is further configured to process an external capacitance detection signal of an external electrode, and an antenna in the earphone is reused as the external electrode.

In the technical solution of the implementation of this application, the capacitance detection apparatus can realize multiple types of capacitance detection, thereby realizing multiple functions. In addition, the antenna is reused as the external electrode for capacitance detection, which can not only reduce the space occupied by the external electrode in the earphone, so as to be beneficial to the realization of the miniaturization development of the earphone, but also can avoid the problem of positional interference between the antenna and the external electrode, and accordingly, can ensure the antenna efficiency of the earphone and the capacitance detection performance of the external electrode.

In some possible implementations, the processing unit is configured to process a capacitance detection signal of the sensing electrode to detect a proximity state of the to-be-measured object; the processing unit is configured to process the external capacitance detection signal of the external electrode to detect a touch state of the to-be-measured object.

In some possible implementations, the capacitance detection signal of the sensing electrode is a capacitance detection signal of a self-capacitance between the sensing electrode and a ground electrode, or; the capacitance detection signal of the sensing electrode is a capacitance detection signal of a mutual capacitance between the sensing electrode and its corresponding transmitting electrode.

In some possible implementations, the sensing electrode includes an electrode pattern, and the electrode pattern is formed on a metal layer on a surface of the circuit board.

In some possible implementations, the processing unit is a processor chip, and the processor chip is packaged to the circuit board through a chip packaging process.

In some possible implementations, the circuit board is a flexible circuit board, and the capacitance detection apparatus further includes: a reinforcing plate, configured to reinforce an area of the flexible circuit board corresponding to the processing unit.

In the technical solution of the implementation of this application, the reinforcing plate is configured to reinforce the area of the flexible circuit board FPC corresponding to the processing unit, thus improving the reliability of the capacitance detection apparatus.

In some possible implementations, the capacitance detection apparatus is fixedly mounted to the front housing of the earphone through an adhesive layer.

In some possible implementations, the processing unit is configured to process the capacitance detection signal to form a digital signal, and the capacitance detection apparatus and a main board of the earphone are electrically connected by a digital signal line, and the main board of the earphone is arranged at the rear housing of the earphone.

In the technical solution of the implementation of this application, the capacitance detection signal of the sensing electrode is an analog signal, which is transmitted to the processing unit through the metal wiring layer in the circuit board, and the processing unit is configured to process the capacitance detection signal to form a digital signal, which can be further transmitted to the main board of the earphone for further operations of the earphone. Therefore, the capacitance detection apparatus located at the front housing of the earphone can be electrically connected to the main board of the earphone located at the rear housing of the earphone through a digital signal line. The digital signal has a high anti-interference ability, and the quality of the signal transmitted between the capacitance detection apparatus and the main board is reliable.

In a second aspect, an earphone is provided, including: the capacitance detection apparatus in the first aspect or any possible implementation of the first aspect.

Since the earphone is provided with the capacitance detection apparatus proposed in this application, the earphone can perform related functions implemented through capacitance detection, for example wearing detection function and the like. In addition, the capacitance detection apparatus provided by this application has good capacitance detection performance and strong anti-interference ability, so related functions of the earphone are implemented accurately, and thus the experience of a user using the earphone can be further improved. Furthermore, the capacitance detection apparatus in this application has the characteristics of modularization and miniaturization, and thus it only occupies a small space in the earphone, which facilitates the miniaturization design of the earphone, and moreover, tests can be performed when the earphone is a semi-manufactured product, that is, tests on related functions can be implemented when the capacitance detection apparatus is assembled at the front housing of the earphone, which improves the production efficiency and yield of the earphone.

DETAILED DESCRIPTION OF THE EMBODIMENTS

The technical solutions in the embodiments of this application will be described below in conjunction with the accompanying drawings.

Figure 1:
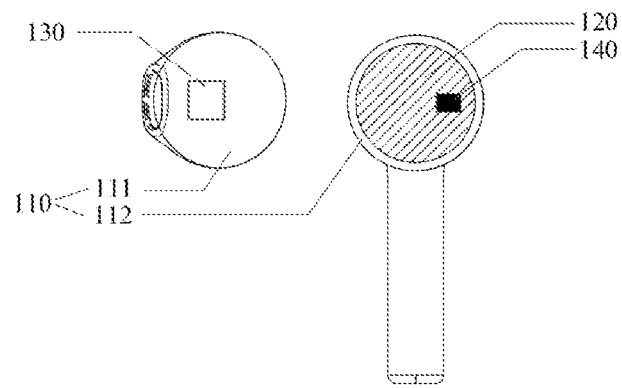
FIG. 1 is a schematic diagram of a capacitance detection apparatus in an earphone according to an embodiment of this application.

As an example, FIG. 1 shows a schematic diagram of a capacitance detection apparatus in an earphone.

As shown in FIG. 1, the earphone 100 includes a housing 110, a main board 120, a capacitance sensing unit 130 and a processing unit 140, where the housing 110 is divided into a front housing 111 and a rear housing 112. In order to facilitate the sensing of a human body by the capacitance sensing unit 130 for capacitance detection, the capacitance sensing unit 130 is generally arranged at the front housing 111, and the processing unit 140 is arranged on the main board 120 located at the rear housing 112.

In an early stage of earphone production, the components at the front housing 111 and the rear housing 112 are independently assembled separately. Therefore, test for related functions of the earphone, such as the in-ear wearing detection function, need to be carried out after the assembly of the whole earphone is completed. Once a test on the whole earphone fails, a sealant needs to be removed and thus the earphone is damaged, resulting in low production efficiency and influencing production yield.

In addition, the signal detected by the capacitance sensing unit 130 is an analog signal, and the analog signal needs to be transmitted to the processing unit 140 through an analog signal line. Therefore, a connection line between the capacitance sensing unit 130 and a port of the main board 120 and a route between the port of the main board 120 and the processing unit 140 are all analog signal lines. Subsequently, in the earphone 100, the analog signal line between the processing unit 140 and the capacitance sensing unit 130 is relatively long, and the analog signal is usually sensitive and easily affected by the environment and other electrical components, thus resulting in a decrease in the accuracy of capacitance detection, thereby affecting functional detections such as in-ear wearing detection.

To sum up, in the above technical solution of the earphone 100, the capacitance sensing unit 130 and the processing unit 140 are separately arranged at the front housing 111 and the rear housing 112 of the earphone, the analog signal line between the capacitance sensing unit 130 and the processing unit 140 is relatively long and the anti-interference ability is poor. In addition, related tests can only be carried out after the assembly of the whole earphone is completed, resulting in low production efficiency and affecting production yield.

Based on this, this application proposes a new capacitance detection apparatus to solve the above technical problem.

Figure 2:
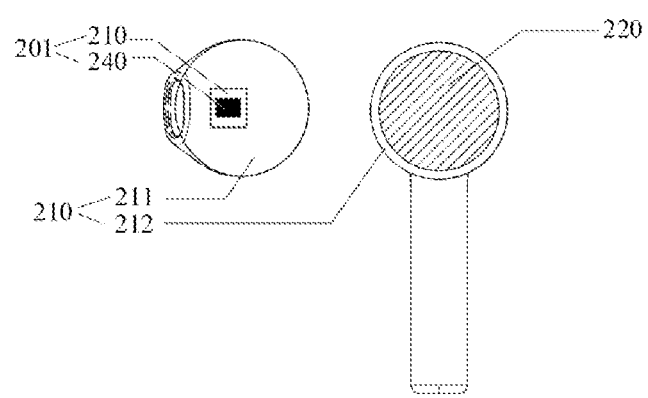
FIG. 2 is a schematic diagram of a capacitance detection apparatus in another earphone according to an embodiment of this application.

FIG. 2 shows a schematic diagram of another earphone 200 proposed in an embodiment of this application.

As shown in FIG. 2, the earphone 200 includes: a capacitance sensing unit 210 and a processing unit 240, where the capacitance sensing unit 210 and the processing unit 240 are integrated to from a capacitance detection module 201, and they are close to each other and can be electrically connected by a short-distance analog line. The capacitance detection module 201 may be assembled at the front housing 211 of the earphone, so as to enable the capacitance sensing unit 210 therein to sense a human body to perform capacitance detection. Further, the signal processed by the processing unit 240 is a digital signal, and the capacitance detection module 201 can be electrically connected to the main board 220 located at the rear housing 212 of the earphone through a digital signal line. The anti-interference ability of the digital signal is strong, and thus the signal quality transmitted between the capacitance detection module 201 and the main board 220 is reliable.

By means of the technical solution of the embodiment of this application, the capacitance sensing unit 210 and the processing unit 240 are integratedly provided as a capacitance detection module, which is more conducive to integration and miniaturization design of the capacitance detection apparatus compared with the separate arrangement of the capacitance sensing unit and the processing unit, thereby saving the occupied space of the capacitance sensing unit 210 and the processing unit 240. In addition, after being integrated into a capacitance detection module design, the analog line between the capacitance sensing unit 210 and the processing unit 240 is very short, which solves the problem that the analog signal is sensitive and interfered, and significantly improves the anti-interference ability of capacitance detection. Further, compared with related technologies, by using the technical solution of this application, tests can be performed in a semi-manufactured product stage (that is, tests on related functions can be implemented when the module is assembled at the front housing of the earphone, thereby improving the production efficiency and yield of the earphone).

It should be noted that, in FIG. 2 above, an application scenario of the embodiment of this application is illustrated with an example where the capacitance detection module 201 is arranged in an earphone. In this application scenario, the capacitance detection module 201 can be configured to perform in-ear wearing detection or other related functional detection of the earphone.

Figure 3:
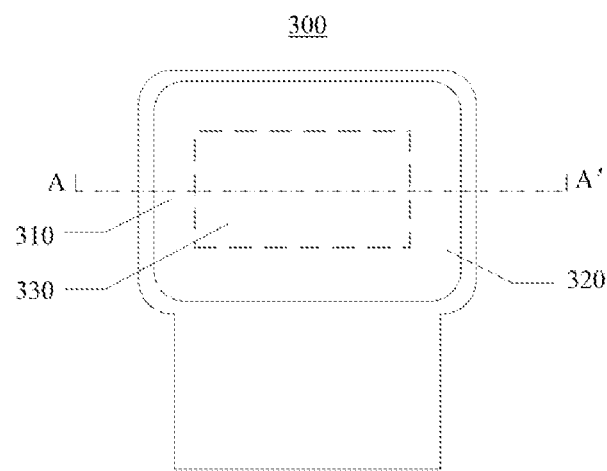
FIG. 3 is a schematic top view of a capacitance detection apparatus according to an embodiment of this application.
Figure 4:
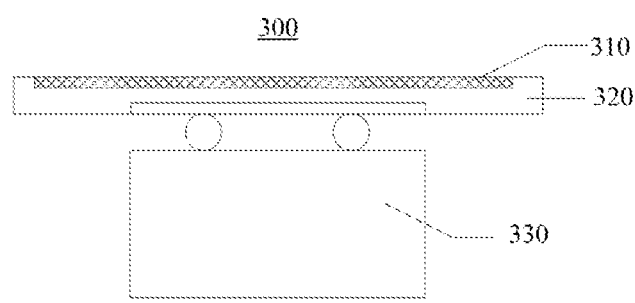
FIG. 4 is a schematic cross-sectional view of a section taken along the line A-A' in FIG. 3.

FIG. 3 and FIG. 4 respectively show a schematic top view and a schematic cross-sectional view of a capacitance detection apparatus 300 provided by an embodiment of this application, where FIG. 4 is a schematic cross-sectional view of a section taken along the line A-A' in FIG. 3. The capacitance detection apparatus 300 in the embodiment of this application may be an implementation of the above capacitance detection module 201, that is, the capacitance detection apparatus 300 in the embodiment of this application is applied to an earphone.

As shown in FIG. 3 and FIG. 4, the capacitance detection apparatus 300 includes: a circuit board 320, a sensing electrode 310 and a processing unit 330, which are provided in a front housing of the earphone, where the circuit board 320, the sensing electrode 310 and the processing unit 330 are integrated together;

The sensing electrode 310 is arranged in a first area of the circuit board 320, the processing unit 330 is arranged in a second area of the circuit board 320, and the sensing electrode 310 and the processing unit 330 are electrically connected through a metal wiring layer in the circuit board 320;

Specifically, the sensing electrode 310 is configured to sense a to-be-measured object and form a capacitance detection signal, the capacitance detection signal is transmitted to the processing unit 330 through the metal wiring layer in the circuit board 320, and the processing unit 330 is configured to process the capacitance detection signal to detect the to-be-measured object.

In the embodiment of this application, the circuit board 320 may be a flexible printed circuit (FPC), which is thin in thickness, soft in material and convenient to be mounted. The circuit board 320 has a metal wiring layer, and the metal wiring layer can be used to electrically connect various electronic components arranged on the circuit board 320.

For the sensing electrode 310, it may be a metal electrode layer with an electrode pattern. In a specific implementation, the sensing electrode 310 may be implemented by etching an electrode pattern on the first area of the surface of the circuit board 320. Optionally, the electrode pattern of the sensing electrode 310 may be a grid pattern or other patterns, which is not specifically limited in the embodiment of this application, and it is intended to reduce load capacitance of the sensing electrode 310.

In a capacitance detection process, a capacitance detection signal formed on the sensing electrode 310 may be a self-capacitance detection signal or a mutual capacitance detection signal. Specifically, in the self-capacitance detection solution, a self-capacitance is formed between the sensing electrode 310 and the ground electrode. As the to-be-measured object (such as a user's human body) approaches, a new capacitance is introduced between the to-be-measured object and the sensing electrode, and thus, the self-capacitance between the sensing electrode 310 and the ground electrode is increased. By processing the self-capacitance detection signal between the sensing electrode 310 and a ground electrode, functions such as proximity detection and touch detection of the to-be-measured object can be implemented.

In the mutual capacitance detection solution, the sensing electrode 310 can be used as a receiving electrode, which has a corresponding transmitting electrode, and a coding signal is formed on the transmitting electrode. A mutual capacitance can be formed between the sensing electrode 310 and its transmitting electrode. As the to-be-measured object approaches, it also affects the mutual capacitance between the sensing electrode 310 and its transmitting electrode. By processing the mutual capacitance detection signal between the sensing electrode 310 and its transmitting electrode, functions such as proximity detection and touch detection of the to-be-measured object can also be implemented.

For the processing unit 330, it may be a chip used for data processing and/or control. The chip includes but is not limited to a microcontroller unit (MCU) chip, a microprocessor chip or other types of processing/controlling chips, and the embodiment of the application does not specifically limit the chip type of the processing unit 330. Optionally, the chip of the processing unit 330 may be packaged on the circuit board 320 by various packaging methods in related technologies. As an example, the chip of the processing unit 330 may be packaged on the circuit board 320 by packaging methods such as chip size package (CSP), dual flat no-Lead (DFN) package, which is not specifically limited in the embodiment of this application.

Optionally, the capacitance detection signal of the sensing electrode 310 is an analog signal, which is transmitted to the processing unit 330 through the metal wiring layer in the circuit board 320, and the processing unit 330 is configured to process the capacitance detection signal to form a digital signal. The signal can be further transmitted to the main board of the earphone located at the rear housing of the earphone to perform further operation for the earphone. Therefore, the capacitance detection apparatus 300 located at the front housing of the earphone can be electrically connected to the main board of the earphone located at the rear housing of the earphone through a digital signal line. The digital signal has a high anti-interference ability, and the quality of the signal transmitted between the capacitance detection apparatus 300 and the main board is reliable.

Based on the technical solution of the embodiment of this application, the sensing electrode 310 and the processing unit 330 are electrically connected through the metal wiring layer in the circuit board 320, and the process is simple and easy to implement. Further, in this implementation, the distance of the analog signal line between the sensing electrode 310 and the processing unit 330 is very short, therefore it has very good anti-interference performance, and is beneficial to the improvement of the capacitance detection performance. In addition, a modular structure is formed by connecting the sensing electrode 310 and the processing unit 330 through the circuit board 320, which is not only more conducive to the realization of the integrated and miniaturized design of the capacitance detection apparatus, but also more convenient for testing the capacitance detection apparatus during the assembly process of the earphone, which can improve the production efficiency and yield of the earphone.

In some related technologies, the sensing electrode is manufactured in the chip of the processing unit through semiconductor process technology to realize the integrated design of the sensing electrode and the processing unit. This implementation process is complicated and difficult to implement. In addition, generally speaking, the chip area of the processing unit is generally small, so the manufacturing area of the sensing electrode is limited upon manufacturing the sensing electrode in the chip, and thus the capacitance of the sensing electrode is affected, and its anti-interference ability of capacitance detection is limited. This application proposes another technical solution with a completely different design idea from the above-mentioned technical solution. The sensing electrode 310 is formed on a surface of the circuit board 320, and the area of the sensing electrode 310 is not restricted, so that a better product solution can be designed from both of the two aspects, i.e., the area of the sensing electrode 310 and the detection performance. Further, the chip of the processing unit 320 of this application does not require special processing, the production efficiency is high, and the packaging process with the circuit board 320 is also easy to implement, and the performance is stable.

Figure 5:
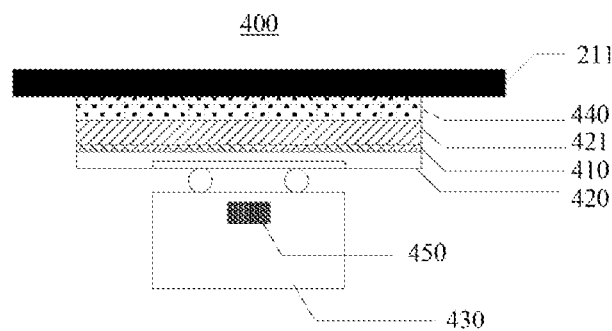
FIG. 5 is a schematic structural diagram of another capacitance detection apparatus according to an embodiment of this application.

Based on the design idea of the capacitance detection apparatus 300 in FIG. 3 and FIG. 4, FIG. 5 shows a schematic structural diagram of another capacitance detection apparatus 400. The capacitance detection apparatus 400 in the embodiment of this application may be another implementation of the above capacitance detection module 201.

As shown in FIG. 5, in the embodiment of this application, the capacitance detection apparatus 400 may include: a sensing electrode 410, a circuit board 420, and a processing unit 430. Optionally, the sensing electrode 410, the circuit board 420 and the processing unit 430 may have the same technical solution as the sensing electrode 310, the circuit board 320 and the processing unit 330 in the embodiment shown in FIG. 3 above. For details, please refer to the above description.

Optionally, in the embodiment of this application, the sensing electrode 410 and the processing unit 430 are respectively arranged on a first surface and a second surface of the circuit board 420, where the first surface is a surface of the circuit board 420 facing the to-be-measured object, and the second surface is a surface of the circuit board 420 facing away from the to-be-measured object.

Based on the solution of this embodiment, a vertical distance between the sensing electrode 410 and the processing unit 430 is very short, which can further reduce the length of the analog signal line between the sensing electrode 410 and the processing unit 430, and can make full use of the space in the vertical direction. Compared with the technical solution where the sensing electrode 410 and the processing unit 430 are both arranged on a same surface of the circuit board 420, the area occupied by the capacitance detection apparatus can be reduced. Further, the sensing electrode 410 is arranged on a surface of the circuit board 420 facing the to-be-measured object, which enables the sensing electrode 410 to sense the to-be-measured object, such as the proximity of a user's human body, more easily and generate a stronger capacitance detection signal to improve the capacitance detection performance.

In addition, in the embodiment of this application, the circuit board 420 is a flexible circuit board FPC, and the capacitance detection apparatus 400 may further include: a reinforcing plate 421, configured to reinforce an area of the flexible circuit board FPC corresponding to the processing unit 430, to improve the reliability of the capacitance detection apparatus 400.

Optionally, as shown in FIG. 5, the reinforcing plate 421 may be arranged on a surface of the sensing electrode 410 and connected to the sensing electrode 410, thereby playing a role of reinforcing the flexible circuit board FPC on the other side of the sensing electrode 410.

In some possible implementations, the capacitance detection apparatus 400 may be mounted to the front housing 211 of the earphone through the adhesive layer 440, or the capacitance detection apparatus 400 may also be mounted to the front housing 211 of the earphone by other mounting ways in related technologies, for example, through fixing pieces such as a slot, a bracket, and the like.

As an example, as shown in FIG. 5, the adhesive layer 440 is arranged on a surface of the reinforcing plate 421, and the reinforcing plate 421 is connected to the front housing 211 of the earphone, so that the capacitance detection apparatus 400 is fixedly mounted in the earphone.

Of course, it is understandable that if the capacitance detection apparatus 400 does not include the reinforcing plate 421, the adhesive layer 540 can be directly arranged on a surface of the sensing electrode 410, and connect the sensing electrode 410 and the front housing 211 of the earphone, so as to enable the capacitance detection apparatus 400 to be fixedly mounted in the earphone.

Generally, since the circuit board 420 is an FPC substrate, the temperature of the sensing electrode 410 on the surface of the circuit board 420 will fluctuate due to the influence of factors, such as a dielectric constant, thermal stability, a thermal expansion coefficient, of the FPC substrate, and thus the capacitance of the sensing electrode 410 and its capacitance detection signal will be caused to drift with the change of the temperature, referred to as temperature drift for short. The aliasing of capacitance temperature drift and the capacitance signal change brought by the to-be-measured object will cause the accuracy of capacitance detection to decrease.

In order to solve the above problem, the capacitance detection apparatus may further include: a temperature drift compensator, provided on the flexible circuit board and configured to compensate for the temperature drift of the capacitance detection signal of the sensing electrode on the flexible circuit board.

In a possible implementation, as shown in FIG. 5, the temperature drift compensator may include: a temperature sensor 450, configured to form a temperature signal, where the temperature signal is used to compensate for the temperature drift of the capacitance detection signal of the sensing electrode 410.

Optionally, in some implementations, since the processing unit 430 and the sensing electrode 410 are close to each other and have similar operating temperatures, as shown in FIG. 5, the temperature sensor 450 may be arranged in the processing unit 430, and is used to detect a temperature signal of the processing unit 430, and the temperature signal of the processing unit is used to represent a temperature of the sensing electrode 410.

Specifically, in the capacitance detection process, the capacitance detection signal of the sensing electrode 410 includes a capacitance reference signal (a capacitance reference signal at a target temperature without any to-be-measured object), a capacitance temperature drift signal (a variation of the capacitance reference signal caused by the temperature drift) and a capacitance signal of the to-be-measured object (a variation of the capacitance reference signal caused by the to-be-measured object). The processing unit 430 can compensate for and correct the capacitance detection signal of the sensing electrode 410 received by the processing unit 430 according to the temperature detected by the temperature sensor 450 to eliminate the capacitance temperature drift signal in the capacitance detection signal and improve the accuracy of capacitance detection.

Optionally, the temperature sensor 450 in the processing unit 430 may be arranged close to the circuit board 420, so that the temperature detected by the temperature sensor 450 is closer to the temperature of the sensing electrode 410, so as to further improve the accuracy of capacitance detection.

Based on the technical solution of the embodiment of this application, since the temperature sensor 450 is added to compensate for the temperature drift of the capacitance detection signal of the sensing electrode 410, the influence of temperature interference on capacitance detection is eliminated. Therefore, the capacitance detection apparatus 400 can have higher accuracy of capacitance detection. Based on the elimination of temperature drift and the improvement of accuracy, the signal amount of the capacitance detection signal of the sensing electrode 410 can be appropriately reduced, which can also meet certain detection requirements. In other words, the area of the sensing electrode 410 can be reduced to further realize size reduction of the capacitance detection apparatus 400, so that it has a wider range of application scenarios.

In addition, the temperature sensor 450 is integrated in the processing unit 430. The temperature sensor 450 does not need to take up space, but can be directly integrated into the processing unit 430, which is also conducive to realizing the size reduction of the capacitance detection apparatus. Further, the measured temperature signal is also close to the temperature of the sensing electrode 410, so the capacitance detection signal of the sensing electrode 410 has a better temperature drift compensation effect.

In addition to the above embodiment shown in FIG. 5, the temperature sensor 450 is used to compensate for the temperature drift of the capacitance of the sensing electrode 410, and the temperature drift of the capacitance detection signal of the sensing electrode 410 can also be reduced or eliminated by a design of differential detection electrodes.

Figure 6:
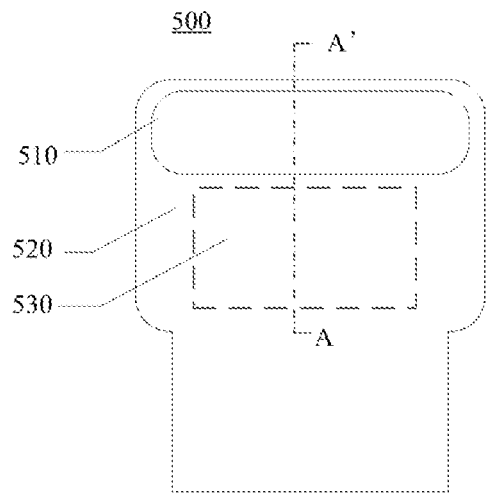
FIG. 6 is a schematic top view of another capacitance detection apparatus according to an embodiment of this application.
Figure 7:
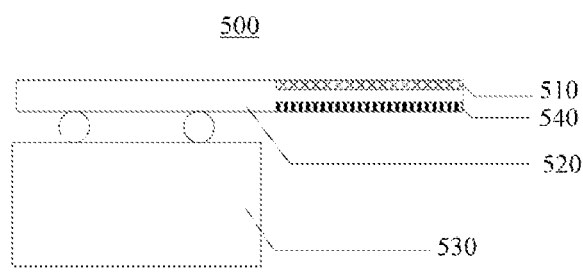
FIG. 7 is a schematic cross-sectional view of a section taken along the line A-A' in FIG. 6.

FIG. 6 and FIG. 7 respectively show a schematic top view and a schematic cross-sectional view of another capacitance detection apparatus 600 provided by an embodiment of this application, where FIG. 7 is a schematic cross-sectional view of a section taken along the line A-A' in FIG. 6. The capacitance detection apparatus 500 in the embodiment of this application may be another implementation of the above capacitance detection module 201.

As shown in FIG. 6 and FIG. 7, in the embodiment of this application, the capacitance detection apparatus 500 may include: a sensing electrode 510, a circuit board 520, and a processing unit 530. Optionally, the sensing electrode 510, the circuit board 520 and the processing unit 530 may have the same technical solution as the circuit board, the sensing electrode and the processing unit in the embodiments shown in FIG. 3 to FIG. 5 above. For details, please refer to the above description.

Optionally, as shown in FIG. 6 and FIG. 7, the capacitance detection apparatus 500 may further include: a reference electrode 540, which serves as a temperature drift compensator and is arranged in a third area of the circuit board 520 to form a reference capacitance detection signal. The reference electrode 540 and the processing unit 530 may be electrically connected through a metal wiring layer in the circuit board 520, and the reference capacitance detection signal of the reference electrode 540 may be used to compensate for the temperature drift of the capacitance detection signal of the sensing electrode 510.

Optionally, the reference electrode 540 may be arranged on a side of the sensing electrode 510 away from the to-be-measured object, and the sensing electrode 510 covers the reference electrode 540. The sensing electrode 510 can be used to shield the influence of the to-be-measured object on the reference capacitance detection signal of the reference electrode 540.

In some possible implementations, the sensing electrode 510 and the reference electrode 540 may implement capacitance detection in a time-division manner, that is, forming their respective capacitance detection signals in a time-division manner. Correspondingly, the processing unit 530 may receive the capacitance detection signal of the sensing electrode 510 and the reference capacitance detection signal of the reference electrode in a time-division manner.

Specifically, in a first period, the sensing electrode 510 is configured to sense the to-be-measured object and form its capacitance detection signal, and the processing unit 530 is configured to receive the capacitance detection signal of the sensing electrode 510. As analyzed in the embodiment of FIG. 5 above, the capacitance detection signal of the sensing electrode 510 can be understood as the sum of the following three capacitance detection signals: a capacitance reference signal (a capacitance reference signal at a target temperature without any to-be-measured object), a capacitance temperature drift signal (a variation of the capacitance reference signal caused by the temperature drift) and a capacitance signal of the to-be-measured object (a variation of the capacitance reference signal caused by the to-be-measured object).

Optionally, in order to ensure the quality of the capacitance detection signal of the sensing electrode 510 in the first period, the reference electrode 540 may receive a ground signal or a direct current signal in the first period to prevent the reference electrode 540 from affecting the capacitance detection signal of the sensing electrode 510.

In a second period, the reference electrode 540 is configured to form its reference capacitance detection signal, and the processing unit 530 is configured to receive the reference capacitance detection signal of the reference electrode 540. During this period, since the sensing electrode 510 is arranged on a side of the reference electrode 540 closer to the to-be-measured object, the sensing electrode 510 can be used as a shielding electrode of the reference electrode 540. Specifically, the sensing electrode 510 is configured to receive a shielding signal, so as to shield the influence of the to-be-measured object on the reference capacitance detection signal of the reference electrode 540. Optionally, the shielding signal may include: a ground signal, a direct current signal, or a signal with a same frequency and phase as the reference capacitance detection signal.

At this time, the reference capacitance detection signal of the reference electrode 540 can be understood as the sum of the following two parts of the capacitance detection signal: a capacitance reference signal (a capacitance reference signal at a target temperature without any to-be-measured object) and a capacitance temperature drift signal (a variation of the capacitance reference signal caused by the temperature drift).

Based on this, the reference capacitance detection signal of the reference electrode 540 does not include the capacitance signal of the to-be-measured object, and the temperature drift of the reference capacitance detection signal of the reference electrode 540 is close to or equal to the temperature drift of the capacitance detection signal of the sensing electrode 510. The processing unit 530 is configured to determine the capacitance signal of the to-be-measured object according to a difference between the capacitance detection signal of the sensing electrode 510 and the reference capacitance detection signal of the reference electrode 540 to detect the to-be-measured object.

It should be noted that, for the formation process of the capacitance detection signal of the sensing electrode 510 and the formation process of the reference capacitance detection signal of the reference electrode 540 in the first period and the second period, reference can be made to the self-capacitance detection solution or the mutual capacitance detection solution in the related art, which will not be described in detail herein.

It should also be noted that, for the implementation of the sensing electrode 510 as a shielding electrode in the second period, reference can also be made to the implementation in the related art, which is not specifically limited in this application.

Under this technical idea, for a product solution, in an example, as shown in FIG. 6 and FIG. 7, the sensing electrode 510 may be located on a first surface of the circuit board 520 (that is, a surface facing the to-be-measured object), and the reference electrode 540 may be located on a second surface of the circuit board 520 (that is, a surface facing away from the to-be-measured object), and the reference electrode 540 and the processing unit 530 are located on the same surface of the circuit board 520 and are respectively located in different areas on the second surface of the circuit board 520.

Optionally, the reference electrode 540 may be implemented by etching an electrode pattern on a surface of the circuit board 520, and the electrode pattern of the reference electrode 540 may be the same as or different from the electrode pattern of the sensing electrode 510.

In addition, in the embodiments shown in FIG. 6 and FIG. 7, the reference electrode 540 and the sensing electrode 510 have the same shape and size, and the reference electrode 540 and the sensing electrode 510 are symmetrically arranged with respect to the circuit board 520. The orthogonal projection of the reference electrode 540 on the plane where the sensing electrode 510 is located may completely overlap the area where the sensing electrode 510 is located.

Therefore, by means of the technical solution of the embodiment of this application, the capacitance reference signal and the capacitance temperature drift signal of the reference electrode 540 and the sensing electrode 510 can be matched to almost the same level. Based on this, the processing unit 530 is used to almost completely obtain the capacitance detection signal of the to-be-measured object according to the difference between the capacitance detection signal of the sensing electrode 510 and the reference capacitance detection signal of the reference electrode 540. The detection result based on the capacitance signal of the to-be-measured object has high accuracy and is hardly affected by the external temperature, and the overall performance of the capacitance detection apparatus 500 is therefore excellent.

Figure 8:
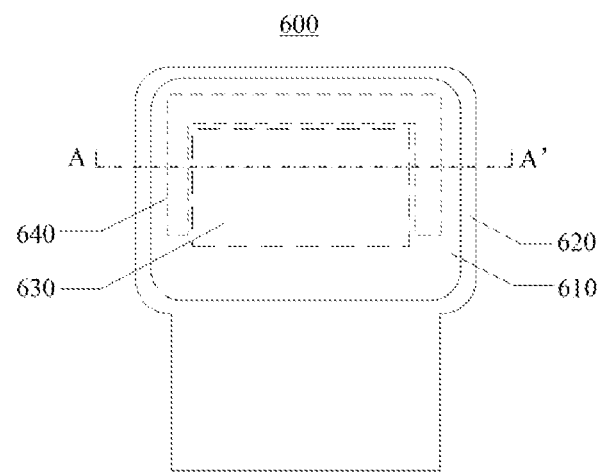
FIG. 8 is a schematic top view of another capacitance detection apparatus according to an embodiment of this application.
Figure 9:
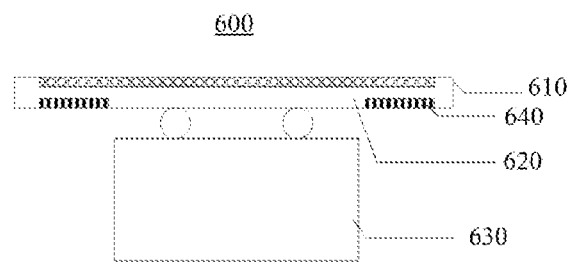
FIG. 9 is a schematic cross-sectional view of a section taken along the line A-A' in FIG. 8.

As another example, FIG. 8 and FIG. 9 respectively show a schematic top view and a schematic cross-sectional view of another capacitance detection apparatus 600 provided by an embodiment of this application, where FIG. 9 is a schematic cross-sectional view of a section taken along the line A-A' in FIG. 8. The capacitance detection apparatus 600 in the embodiment of this application may be another implementation of the above capacitance detection module 201.

As shown in FIG. 8 and FIG. 9, in the embodiment of this application, the capacitance detection apparatus 600 may include: a sensing electrode 610, a circuit board 620, and a processing unit 630. Optionally, the sensing electrode 610, the circuit board 620 and the processing unit 630 may have the same technical solution as the circuit board, the sensing electrode and the processing unit in the embodiments shown in FIG. 3 to FIG. 7 above. For details, please refer to the above description.

Optionally, as shown in FIG. 8 and FIG. 9, the capacitance detection apparatus 600 may also include: a reference electrode 640, the function of the reference electrode 640 is the same as the function of the reference electrode 640 in FIG. 6 and FIG. 7 above, and the reference electrode 640 can be used as a temperature drift compensator. Optionally, the reference electrode 640 is also arranged on a side of the sensing electrode 610 away from the to-be-measured object, and the sensing electrode 610 is configured to shield the influence of the to-be-measured object on the reference capacitance detection signal of the reference electrode 640. In the embodiment of this application, for the processing method of the processing unit 630 on the capacitance detection signal of the sensing electrode 610 and the reference capacitance detection signal of the reference electrode 640, reference can be made to the relevant description in the embodiment shown in FIG. 6 and FIG. 7 above, which will not be repeated herein.

Specifically, in the embodiment of this application, the reference electrode 640 may be arranged around the processing unit 630, and the reference electrode 640 and the sensing electrode 610 are asymmetrical structures, and the two cannot completely correspond to each other, where the area of the sensing electrode 610 is larger than the area of the reference electrode 640, to increase the capacitance detection signal of the sensing electrode 610, and the sensing electrode 610 covers a side of the reference electrode 640 facing the to-be-measured object, so as to function as a shielding electrode. In other words, in the embodiment of this application, the orthographic projection of the reference electrode 640 on the plane where the sensing electrode 610 is located is completely located in the area where the sensing electrode 610 is located.

By means of the technical solution of the embodiment of this application, the surface area of the circuit board 620 can be fully utilized to integrate the sensing electrode 610, the reference electrode 640, and the processing unit 630, and therefore the overall occupied area is small. However, at this time, the reference electrode 640 and the sensing electrode 610 are asymmetric structures, and the two cannot completely correspond to each other. Therefore, the capacitance temperature drift signal generated by the reference electrode 640 and the sensing electrode 610 affected by the temperature is different. In the signal detected by the processing unit 630 according to the difference between the capacitance detection signal of the sensing electrode 610 and the reference capacitance detection signal of the reference electrode 640, in addition to the capacitance signal of the to-be-measured object, there may remain a part of the capacitance temperature drift signal, which has a certain impact on the accuracy of capacitance detection.

Figure 10:
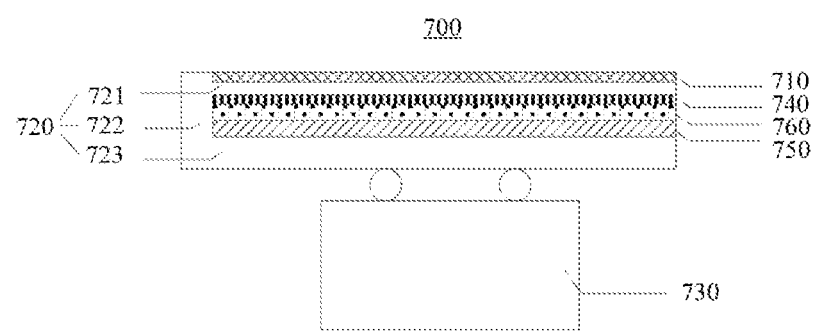
FIG. 10 is a schematic cross-sectional view of another capacitance detection apparatus according to an embodiment of this application.

In order to meet the requirements of capacitance detection accuracy and miniaturization of the capacitance detection apparatus 600 at the same time, FIG. 10 shows a schematic cross-sectional view of another capacitance detection apparatus 700 provided by an embodiment of this application. The capacitance detection apparatus 700 in the embodiment of this application may be another implementation of the above capacitance detection module 201.

As shown in FIG. 10, in the embodiment of this application, the capacitance detection apparatus 700 may include: a sensing electrode 710, a circuit board 720, a processing unit 730, and a reference electrode 740.

In the embodiment of this application, the circuit board 720 is a flexible circuit board FPC, which includes a first partial circuit board 721, a bending portion 722, and a second partial circuit board 723, where the first partial circuit board 721 and the second partial circuit board 723 are stacked, the ends of the first partial circuit board 721 and the second partial circuit board 723 on a same side are connected by the bending portion 722.

As shown in FIG. 10, the sensing electrode 710 and the reference electrode 740 can be arranged on the first partial circuit board 721, while the processing unit 730 can be arranged on the second partial circuit board 723, and the first partial circuit board 721 is arranged toward the to-be-measured object relative to the second partial circuit board 723, so that it is convenient for the sensing electrode 710 and the reference electrode 740 to detect capacitance signals of the to-be-measured object.

In some implementations, the sensing electrode 710 may be arranged on a first surface of the first partial circuit board 721, the processing unit 730 may be arranged on a second surface of the second partial circuit board 723, and the reference electrode 740 may be arranged on a second surface of the first partial circuit board 721 or may also be arranged on a first surface of the second partial circuit board 723, where the first surface is a surface facing the to-be-measured object, and the second surface is a surface facing away from the to-be-measured object.

Preferably, as shown in FIG. 10, the reference electrode 740 is arranged on the second surface of the first partial circuit board 721 to reduce the distance between the sensing electrode 710 and the reference electrode 740, so that the temperature of the sensing electrode 710 and the temperature of the reference electrode 740 are kept or close to the same.

Further, in this implementation, the reference electrode 740 and the first surface of the second partial circuit board 723 can be connected to each other through an adhesive layer 760, so as to realize a stable connection between the first partial circuit board 721 and the second partial circuit board 723, thereby improving the mechanical stability of the capacitance detection apparatus 700.

It can be understood that, in the embodiment of this application, the first surface of the second partial circuit board 723 may be provided with a reinforcing plate 750 to reinforce the second partial circuit board 723, thereby supporting the processing unit 730. In this case, the adhesive layer 760 is arranged between the reference electrode 740 and the reinforcing plate 750 to achieve a stable connection between the first partial circuit board 721 and the second partial circuit board 723.

Specifically, in the embodiment of this application, reference can be made to the related designs of the sensing electrode 510 and the reference electrode 540 in FIG. 6 and FIG. 7 for the sensing electrode 710 and the reference electrode 740, that is, the sensing electrode 710 and the reference electrode 740 are symmetrically arranged relative to the first partial circuit board 721, and the shape and size of the reference electrode 740 are completely the same as those of the sensing electrode 710. Therefore, the capacitance reference signal and the capacitance temperature drift signal of the reference electrode 740 and the sensing electrode 710 can be matched to almost the same level. Based on this, the processing unit 730 is used to almost completely obtain the capacitance detection signal of the to-be-measured object according to the difference between the capacitance detection signal of the sensing electrode 710 and the reference capacitance detection signal of the reference electrode 740. The detection result based on the capacitance signal of the to-be-measured object has high accuracy and is hardly affected by the external temperature, and the overall performance of the capacitance detection apparatus 700 is excellent.

In addition, by means of the technical solution of the embodiment of this application, the first partial circuit board 721 and the second partial circuit board 723 are stacked and connected by the bending portion 722, and the sensing electrode 710 and the reference electrode 740 are arranged on the first partial circuit board 721, the processing unit 730 is arranged on the second partial circuit board 722, and the processing unit 730, the sensing electrode 710 and the reference electrode 740 are also stacked. Therefore, the capacitance detection apparatus 700 in the embodiment of this application occupies a small area, and since the thickness of the circuit board is very thin, even if the first partial circuit board and the second partial circuit board are stacked, it will not occupy too much extra thickness.

To sum up, based on the technical solution of the embodiment of this application, the space of the capacitance detection apparatus can be further reduced while ensuring high accuracy of the capacitance detection signal of the capacitance detection apparatus, and the overall performance of the capacitance detection apparatus can be further improved.

Optionally, in the embodiments as shown in FIG. 6 to FIG. 10 above, the capacitance detection apparatus 500, the capacitance detection apparatus 600, or the capacitance detection apparatus 700 may also be mounted to the front housing 211 of the earphone through an adhesive layer.

Therefore, in the embodiments shown in FIG. 6 to FIG. 10, the sensing electrode is arranged on a surface of the circuit board facing the front housing 211, and the processing unit is arranged on a surface of the circuit board facing away from the front housing 211. In other words, the sensing electrode is arranged on a surface of the circuit board facing the to-be-measured object, and the processing unit is arranged on a surface of the circuit board facing away from the to-be-measured object, so that the sensing electrode can more easily sense the approach of the to-be-measured object, such as the user's human body, and generate a stronger capacitance detection signal, thereby improving capacitance detection performance.

In the embodiments shown in FIG. 3 to FIG. 10 above, the processing unit in the capacitance detection apparatus processes the capacitance detection signals of the sensing electrode and the reference electrode. Optionally, the processing unit may also be configured to process capacitance detection signals of other external electrodes.

Figure 11:
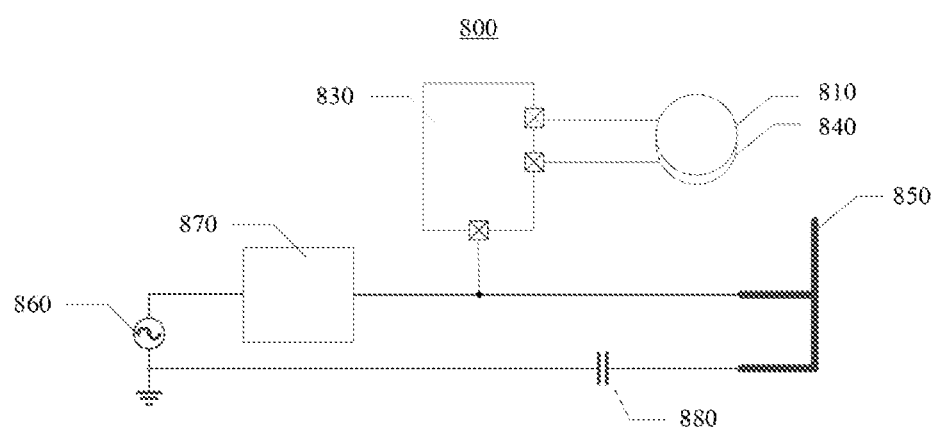
FIG. 11 is a schematic functional block diagram of another capacitance detection apparatus according to an embodiment of this application.

FIG. 11 shows a schematic functional block diagram of another capacitance detection apparatus 800 provided by an embodiment of this application.

As shown in FIG. 11, in the embodiment of this application, the capacitance detection apparatus 800 may include: a sensing electrode 810, a circuit board (not shown in FIG.

11), and a processing unit 830. Optionally, the capacitance detection apparatus 800 may also include a reference electrode 840. Specifically, for the implementation of the sensing electrode 810, the circuit board, the processing unit 830 and the reference electrode 840 described above, reference can be made to the relevant description in any of the above embodiments.

As shown in FIG. 11, the processing unit 830 is a processor chip, which may have multiple capacitance detection channels, where two capacitance detection channels can be configured to receive the capacitance detection signal of the sensing electrode 810 and the reference capacitance detection signal of the reference electrode 840, and a third capacitance detection channel may also be configured to receive an external capacitance detection signal of an external electrode 850, and the processing unit 830 may process multiple capacitance detection signals to implement related detection functions. Optionally, the external electrode 850 includes, but is not limited to, a touch electrode, a pressure electrode, or an electrode that implements other functional detections, and the specific function of the external electrode 850 is not limited in the embodiment of this application.

In the embodiment of this application, the external electrode 850 can be arranged at any position in the earphone where the capacitance detection apparatus 800 is located according to actual design requirements. In order to reduce the space occupied by the external electrode 850 in the earphone, in the embodiment of this application, a metal element in the earphone may be reused as the external electrode 850.

As an example, as shown in FIG. 11, in order to achieve the communication function of the earphone, an antenna is generally configured in the earphone, and the antenna is usually designed with a pattern to improve the transceiving function of the antenna, so the antenna in the earphone may be reused as the external electrode 850 of the embodiment of this application. Based on this, the processing unit 830 may receive the external capacitance detection signal of the antenna as the external electrode 850 and process the external capacitance detection signal.

Optionally, the processing unit 830 may be configured to process the capacitance detection signal of the sensing electrode 810 to detect a proximity state of the to-be-measured object; and to process the external capacitance detection signal of the external electrode 850 to detect a touch state of the to-be-measured object.

Optionally, in order to meet the functional requirements of the antenna, the earphone is also equipped with a radio frequency circuit, which may include a power amplifier, a filter, a matching circuit, etc. Only for illustration, FIG. 11 shows the connection relationship among a power amplifier (PA) 860, a filter 870 and an antenna, where an output of the power amplifier 860 is connected to the antenna through the filter 870, which is a high pass filter (HPF).

Optionally, an end of the antenna is connected to the processing unit 830, and another end is connected to the ground through an AC grounding capacitance 880. Optionally, in some embodiments, a low pass filter (LPF) may also be connected between the antenna and the processing unit 830 to filter out high frequency components in the signal received by the antenna and transmit only the capacitance detection signal of a low frequency component therein to the processing unit 830, or, in other implementation, the low pass filter LPF may also be integrated inside the processing unit 830, and this implementation can further reduce the space occupied by related circuits in the earphone.

Based on this, in the technical solution of the embodiment of this application, the capacitance detection apparatus can implement multiple types of capacitance detection, and thereby can implement multiple functions. In addition, the antenna is reused as the external electrode for capacitance detection, which can not only reduce the space occupied by the external electrode in the earphone, so as to facilitate the realization of the miniaturization development of the earphone, but also can avoid the problem of positional interference between the antenna and the external electrode, and accordingly, can ensure the antenna efficiency of the earphone and the capacitance detection performance of the external electrode.

In addition, this application further provides an earphone, including the capacitance detection apparatus in any of the above embodiments.

Since the earphone is provided with the capacitance detection apparatus proposed in this application, the earphone can perform related functions implemented through capacitance detection, for example, man-machine interaction functions such as wearing detection function, touch control function, pressing pressure detection function, thereby improving the experience of a user using the earphone.

In addition, the capacitance detection apparatus provided by this application has good capacitance detection performance and strong anti-interference ability, and thus related functions of the earphone, such as wearing detection, are implemented with high accuracy, thereby further improving the experience of a user using the earphone.

Furthermore, the capacitance detection apparatus in this application has the characteristics of modularization and miniaturization, and thus, it not only occupies a small space in the earphone, thereby facilitating the miniaturization design of the earphone, but also it can be tested when the earphone is a semi-manufactured product, that is, tests on related functions can be implemented when the capacitance detection apparatus is assembled to the front housing of the earphone, thus improving the production efficiency and yield of the earphone.

It should be understood that the specific examples in this document are only intended to help those skilled in the art to better understand the embodiments of this application, rather than limiting the scope of the embodiments of this application.

It should also be understood that the various implementations described in this specification may be implemented individually or in combination, which is not limited in the embodiments of this application.

Unless otherwise specified, all technical and scientific terms used in the embodiments of this application have the same meaning as commonly understood by those skilled in the technical field of this application. The terms used in this application are only for the purpose of describing specific embodiments, and are not intended to limit the scope of this application. The term "and/or" as used in this application includes any and all combinations of one or more related listed items. The singular forms of "a/an", "above" and "the" used in the embodiments of this application and the appended claims are also intended to include plural forms, unless the context clearly indicates other meanings.

Those of ordinary skill in the art can realize that the units of each example described in connection with the embodiments disclosed herein can be implemented in electronic hardware, computer software or a combination thereof. In order to clearly explain the interchangeability of hardware and software, the composition and steps of respective examples have been generally described according to functions in the above description. Whether these functions are executed by hardware or software depends on the specific application and design constraint conditions of the technical solution. Those skilled in the art can use different methods to implement the described functions for each specific application, but such implementation should not be considered beyond the scope of this application.

In the several embodiments provided in this application, it should be understood that the disclosed systems and devices may be implemented in other ways. For example, the device embodiments described above are only illustrative. For example, the division of the units is only a logical function division, and there may be other divisions in actual implementation, for example, multiple units or components may be combined or integrated into another system, or some features can be ignored or not implemented. In addition, the displayed or discussed mutual coupling or direct coupling or communication connection may be indirect coupling or communication connection through some interfaces, devices or units, and may also be electrical, mechanical or other forms of connection.

The units described as separate components may or may not be physically separated, and the components displayed as units may or may not be physical units, that is, they may be located in one place, or may be distributed on multiple network units. Some or all of the units may be selected according to actual needs to achieve the purpose of the solutions of the embodiments of this application.

In addition, each functional unit in each embodiment of this application may be integrated into one processor, or each unit may exist alone physically, or two or more units may be integrated into one unit. The above-mentioned integrated unit may be implemented in the form of hardware or software functional unit.

The integrated units, when implemented in the form of software functional units and sold or used as an independent product, may be stored in a computer readable storage medium. Based on this understanding, the technical solution of this application essentially, a part that contributes to the prior art, or all or part of the technical solution can be embodied in the form of a software product, and the computer software product is stored in a storage medium and includes several instructions to cause a computer equipment (which may be a personal computer, a server, or a network equipment, etc.) to execute all or part of the steps of the method described in each embodiment of this application. The aforementioned storage media include: a USB flash drive, a mobile hard disk, a read-only memory (ROM), a random access memory (RAM), a magnetic disk or an optical disk, and other media that can store program code.

The above are only specific implementations of this application, but the protection scope of this application is not limited to this. Any technical personnel familiar with this technical field can easily think of various equivalent modifications or substitutions within the technical scope disclosed in this application, and these modifications or substitutions should be covered within the protection scope of this application. Therefore, the protection scope of this application shall be subject to the protection scope of the claims.

What is claimed is:

1. A capacitance detection apparatus applied to an earphone, the earphone comprising a front housing and a rear housing, and the capacitance detection apparatus comprises:
    a circuit board, a sensing electrode and a processing unit which are provided at the front housing of the earphone, wherein the circuit board, the sensing electrode and the processing unit are integrated together;
    wherein the sensing electrode is arranged in a first area of the circuit board, the processing unit is arranged in a second area of the circuit board, and the sensing electrode and the processing unit are electrically connected through a metal wiring layer in the circuit board;
    the sensing electrode is configured to sense a to-be-measured object and form a capacitance detection signal, the capacitance detection signal is transmitted to the processing unit through the metal wiring layer, and the processing unit is configured to process the capacitance detection signal to detect the to-be-measured object;
    wherein the circuit board is a flexible circuit board, and the capacitance detection apparatus further comprises: a temperature drift compensator, provided on the flexible circuit board and configured to compensate for a temperature drift of the capacitance detection signal of the sensing electrode on the flexible circuit board.

2. The capacitance detection apparatus according to claim 1, wherein the sensing electrode and the processing unit are respectively arranged on a first surface and a second surface of the circuit board, wherein the first surface is a surface of the circuit board facing the to-be-measured object, and the second surface is a surface of the circuit board facing away from the to-be-measured object.

3. The capacitance detection apparatus according to claim 1, wherein the temperature drift compensator comprises: a reference electrode arranged in a third area of the circuit board and configured to form a reference capacitance detection signal, wherein the reference electrode and the processing unit are electrically connected through the metal wiring layer in the circuit board; the reference capacitance detection signal of the reference electrode is configured to compensate for the temperature drift of the capacitance detection signal of the sensing electrode.

4. The capacitance detection apparatus according to claim 3, wherein the reference electrode is arranged on a side of the sensing electrode away from the to-be-measured object, and the sensing electrode covers the reference electrode.

5. The capacitance detection apparatus according to claim 4, wherein in a first period, the sensing electrode is configured to sense the to-be-measured object and form the capacitance detection signal; and
    in a second period, the reference electrode is configured to form the reference capacitance detection signal, and the sensing electrode is configured to receive a shielding signal to shield influence of the to-be-measured object on the reference capacitance detection signal of the reference electrode, wherein the shielding signal comprises: a ground signal, a direct current signal, or a signal with a same frequency and phase as the reference capacitance detection signal.

6. The capacitance detection apparatus according to claim 5, wherein in the first period, the reference electrode is configured to receive a ground signal or a direct current signal to prevent the reference electrode from influencing the capacitance detection signal of the sensing electrode.

7. The capacitance detection apparatus according to claim 3, wherein the sensing electrode is arranged on the first surface of the circuit board, the processing unit and the reference electrode are arranged on the second surface of the circuit board, wherein the first surface is a surface of the circuit board facing the to-be-measured object, and the second surface is a surface of the circuit board facing away from the to-be-measured object.

8. The capacitance detection apparatus according to claim 7, wherein the reference electrode and the sensing electrode have a same shape and size, and the reference electrode and the sensing electrode are arranged symmetrically with respect to the circuit board.

9. The capacitance detection apparatus according to claim 3, wherein the circuit board comprises: a first partial circuit board, a bending portion, and a second partial circuit board, wherein the first partial circuit board and the second partial circuit board are stacked and connected with each other through the bending portion; and
   the sensing electrode and the reference electrode are arranged on the first partial circuit board, the processing unit is arranged on the second partial circuit board, and the first partial circuit board is arranged toward the to-be-measured object relative to the second partial circuit board.

10. The capacitance detection apparatus according to claim 9, wherein the sensing electrode and the reference electrode are respectively arranged on a first surface and a second surface of the first partial circuit board, and the processing unit is arranged on a second surface of the second partial circuit board, wherein the first surface is a surface of the first partial circuit board and the second partial circuit board facing the to-be-measured object, and the second surface is a surface of the first partial circuit board and the second partial circuit board facing away from the to-be-measured object.

11. The capacitance detection apparatus according to claim 10, wherein the reference electrode and the sensing electrode have a same shape and size, and the reference electrode and the sensing electrode are arranged symmetrically with respect to the first partial circuit board.

12. The capacitance detection apparatus according to claim 1, wherein the temperature drift compensator comprises: a temperature sensor integrated in the processing unit, and a temperature signal of the temperature sensor is configured to compensate for the temperature drift of the capacitance detection signal of the sensing electrode.

13. The capacitance detection apparatus according to claim 1, wherein the processing unit is further configured to process an external capacitance detection signal of an external electrode, and an antenna in the earphone is reused as the external electrode.

14. The capacitance detection apparatus according to claim 13, wherein the processing unit is configured to process the capacitance detection signal of the sensing electrode to detect a proximity state of the to-be-measured object; and
   the processing unit is configured to process the external capacitance detection signal of the external electrode to detect a touch state of the to-be-measured object.

15. The capacitance detection apparatus according to claim 1, wherein the capacitance detection signal of the sensing electrode is a capacitance detection signal of a self-capacitance between the sensing electrode and a ground electrode; or
   the capacitance detection signal of the sensing electrode is a capacitance detection signal of a mutual capacitance between the sensing electrode and its corresponding transmitting electrode.

16. The capacitance detection apparatus according to claim 1, wherein the circuit board is a flexible circuit board, and the capacitance detection apparatus further comprises:
   a reinforcing plate, configured to reinforce an area of the flexible circuit board corresponding to the processing unit.

17. The capacitance detection apparatus according to claim 1, wherein the capacitance detection apparatus is fixedly mounted to the front housing of the earphone by an adhesive layer.

18. The capacitance detection apparatus according to claim 1, wherein the processing unit is configured to process the capacitance detection signal to form a digital signal, and the capacitance detection apparatus and a main board of the earphone are electrically connected by a digital signal line, and the main board of the earphone is arranged at the rear housing of the earphone.

19. The capacitance detection apparatus according to claim 1, wherein the sensing electrode comprises an electrode pattern, and the electrode pattern is formed on a metal layer on a surface of the circuit board.

20. An earphone, comprising:
   a capacitance detection apparatus, a front housing, and a rear housing, wherein the capacitance detection apparatus comprises:
   a circuit board, a sensing electrode, and a processing unit which are provided at the front housing of the earphone, wherein the circuit board, the sensing electrode and the processing unit are integrated together;
   wherein the sensing electrode is arranged in a first area of the circuit board, the processing unit is arranged in a second area of the circuit board, and the sensing electrode and the processing unit are electrically connected through a metal wiring layer in the circuit board; and
   the sensing electrode is configured to sense a to-be-measured object and form a capacitance detection signal, the capacitance detection signal is transmitted to the processing unit through the metal wiring layer, and the processing unit is configured to process the capacitance detection signal to detect the to-be-measured object;
   wherein the circuit board is a flexible circuit board, and the capacitance detection apparatus further comprises: a temperature drift compensator, provided on the flexible circuit board and configured to compensate for a temperature drift of the capacitance detection signal of the sensing electrode on the flexible circuit board.

* * * * *